(12) United States Patent
Dixon

(10) Patent No.: US 9,788,536 B1
(45) Date of Patent: Oct. 17, 2017

(54) HANDHELD DATA-LOGGING SPRAY APPARATUS

(71) Applicant: Jeremy D. Dixon, Key Largo, FL (US)

(72) Inventor: Jeremy D. Dixon, Key Largo, FL (US)

(73) Assignee: The United States of America, as represented by The Secretary of The Interior, Washington, DC (US)

( * ) Notice: Subject to any disclaimer, the term of this patent is extended or adjusted under 35 U.S.C. 154(b) by 775 days.

(21) Appl. No.: 14/168,729

(22) Filed: Jan. 30, 2014

(51) Int. Cl.
*G06F 19/00* (2011.01)
*A01M 7/00* (2006.01)
*H05K 13/00* (2006.01)

(52) U.S. Cl.
CPC ........... *A01M 7/0089* (2013.01); *H05K 13/00* (2013.01)

(58) Field of Classification Search
CPC .................. B05B 12/00; B05B 9/085
See application file for complete search history.

(56) References Cited

U.S. PATENT DOCUMENTS

| | | | | |
|---|---|---|---|---|
| 5,948,043 | A | * | 9/1999 | Mathis ................... G01C 21/30 342/357.52 |
| 6,018,314 | A | * | 1/2000 | Harshbarger ........... G01S 19/18 342/357.43 |
| 7,175,104 | B2 | | 2/2007 | Allen |
| 7,848,865 | B2 | | 12/2010 | Di Federico |
| 2010/0146159 | A1 | * | 6/2010 | Lerman .................... G06F 8/665 710/23 |
| 2014/0084081 | A1 | * | 3/2014 | Kunz ........................ E01H 3/02 239/172 |

FOREIGN PATENT DOCUMENTS

GB            2447681 A  *  9/2008  .......... A01M 7/0089

OTHER PUBLICATIONS

"SprayLogger—"Less Desk Time; More Spray Time"", Printed Dec. 11, 2013, https://www.spraylogger.com/, 7 pages.

* cited by examiner

*Primary Examiner* — Elias Desta
(74) *Attorney, Agent, or Firm* — John D. Fado; Robert D. Jones

(57) ABSTRACT

The handheld data-logging spray apparatus incorporates a global positioning system (GPS) receiver and microcontroller into a conventional handheld spray unit. As an operator dispenses a chemical using the handheld data-logging spray apparatus, the microcontroller records (among other things) the volume of chemical dispensed and the GPS location of the sprayer. The recorded data is processed and stored on a removable USB thumb drive. The operator can download the data from the thumb drive and manipulate the data using a conventional spreadsheet program or a commercially-available geographic information system program.

19 Claims, 6 Drawing Sheets

| WAYPOINT | TARGET | DATE_TIME | LAT | LONG | SAT | PRECISION | mLS |
|---|---|---|---|---|---|---|---|
| 1 | Target_Species_D | 11/04/2012_16:36:40.92 | 34.73756027 | -98.43093872 | 4 | 400 | 2.083 |
| 2 | Target_Species_D | 11/04/2012_16:36:45.92 | 34.73754883 | -98.43094635 | 4 | 400 | 9.583 |
| 3 | Target_Species_D | 11/04/2012_16:36:48.92 | 34.73754883 | -98.43094635 | 4 | 400 | 4.167 |
| 4 | Target_Species_D | 11/04/2012_16:36:54.92 | 34.73756027 | -98.43094635 | 4 | 400 | 6.667 |
| 2 | Target_Species_D | 11/04/2012_16:55:54.00 | 34.73754883 | -98.43092346 | 5 | 230 | 2.5 |
| 3 | Target_Species_C | 11/04/2012_16:55:57.00 | 34.7375412 | -98.43090057 | 5 | 230 | 2.5 |
| 4 | Target_Species_B | 11/04/2012_16:56:02.00 | 34.73754883 | -98.43089294 | 4 | 260 | 2.917 |
| 5 | Target_Species_C | 11/04/2012_16:56:06.00 | 34.73756027 | -98.43089294 | 5 | 230 | 5.833 |
| 6 | Target_Species_C | 11/04/2012_16:56:09.00 | 34.73759842 | -98.43090057 | 5 | 230 | 4.583 |
| 7 | Target_Species_C | 11/04/2012_16:56:12.00 | 34.73760986 | -98.43093109 | 5 | 230 | 3.333 |
| 8 | Target_Species_C | 11/04/2012_16:56:16.00 | 34.73760986 | -98.43093872 | 5 | 230 | 1.667 |
| 9 | Target_Species_C | 11/04/2012_16:56:22.00 | 34.73759842 | -98.43096161 | 5 | 230 | 5.833 |
| 10 | Target_Species_C | 11/04/2012_16:56:25.00 | 34.73759079 | -98.43097687 | 5 | 230 | 3.75 |
| 11 | Target_Species_C | 11/04/2012_16:56:28.00 | 34.73759079 | -98.43097687 | 5 | 230 | 5.417 |
| 12 | Target_Species_C | 11/04/2012_16:56:31.00 | 34.73757935 | -98.43097687 | 5 | 230 | 5.417 |
| 13 | Target_Species_C | 11/04/2012_16:56:34.00 | 34.73757172 | -98.43099213 | 5 | 160 | 5.833 |
| 14 | Target_Species_C | 11/04/2012_16:56:37.00 | 34.73756027 | -98.43097687 | 6 | 140 | 5.417 |
| 15 | Target_Species_C | 11/04/2012_16:56:40.00 | 34.73756027 | -98.43097687 | 6 | 140 | 5 |
| 16 | Target_Species_F | 11/04/2012_16:56:43.00 | 34.73757172 | -98.43097687 | 6 | 140 | 2.083 |
| 17 | Target_Species_B | 11/04/2012_16:56:46.00 | 34.73757172 | -98.43097687 | 6 | 140 | 3.75 |
| 18 | Target_Species_C | 11/04/2012_16:56:49.00 | 34.73756027 | -98.43097687 | 6 | 140 | 4.583 |
| 19 | Target_Species_D | 11/04/2012_16:56:52.00 | 34.73756027 | -98.43096924 | 6 | 140 | 4.167 |
| 20 | Target_Species_D | 11/04/2012_16:56:55.00 | 34.73756027 | -98.43094635 | 6 | 140 | 2.917 |
| 21 | Target_Species_F | 11/04/2012_16:56:59.00 | 34.73756027 | -98.43093109 | 5 | 200 | 5.417 |
| 22 | Target_Species_F | 11/04/2012_16:57:02.00 | 34.73756027 | -98.43093109 | 4 | 280 | 2.5 |
| 23 | Target_Species_E | 11/04/2012_16:57:06.00 | 34.73757172 | -98.43093109 | 6 | 140 | 2.917 |
| 24 | Target_Species_F | 11/04/2012_16:57:09.00 | 34.73757935 | -98.43093109 | 6 | 140 | 1.667 |
| 25 | Target_Species_D | 11/04/2012_16:57:12.00 | 34.73759079 | -98.43093872 | 6 | 140 | 1.667 |
| 26 | Target_Species_B | 11/04/2012_16:57:15.00 | 34.73759079 | -98.43093872 | 6 | 140 | 1.667 |
| 27 | Target_Species_A | 11/04/2012_16:57:19.00 | 34.73759079 | -98.43093109 | 6 | 140 | 2.5 |
| 28 | Target_Species_C | 11/04/2012_16:57:22.00 | 34.73759079 | -98.43092346 | 6 | 140 | 0.833 |
| 29 | Target_Species_E | 11/04/2012_16:57:25.00 | 34.73759079 | -98.43092346 | 6 | 140 | 1.25 |
| 30 | Target_Species_E | 11/04/2012_16:57:29.00 | 34.73759079 | -98.4309082 | 6 | 140 | 7.083 |

HANDHELD DATA-LOGGING SPRAY APPARATUS

FIELD OF THE INVENTION

The disclosed apparatus relates to a handheld spraying mechanism with an integrated data recorder. Specifically, the apparatus described herein relates to a handheld tool for simultaneously spraying a liquid chemical (herbicide) and recording time, global positioning system (GPS) information, the volume of the chemical dispensed, and other relevant data.

BACKGROUND OF THE INVENTION

An "invasive plant" is usually defined as a non-native (or alien) species whose introduction causes economic or environmental harm, or harm to human and/or wildlife health. For example, free living populations of invasive species such as Chinese wisteria, kudzu, and Australian pine comprise significant threats to native plants and animals in the U.S. These plants cause over $150 billion in losses to the American economy annually.

Efforts to control invasive species are frequently piecemeal and lack a comprehensive and systematic plan. Many farmers and land managers currently lack the basic tools to combat the problem. Although herbicides are routinely used to kill a target invasive species, the targeted invasive species and the amounts and types of herbicides are rarely recorded so that land managers can easily map and share the electronic data.

Although there are some existing spray systems that electronically record herbicide data, the prior art systems are generally a component of a large, wheeled-type spray applicator that is towed or mounted on a motorized vehicle like a truck, tractor, or all-terrain vehicle. Commercially available SPRAYLOGGER systems comprise examples of vehicle-based spray systems that fall into this category. These systems incorporate monitoring and recording devices, but the recording devices are stand-alone "boxes" that are not integrated into a handheld sprayer system.

Although backpack-type manual spray systems are available, very few of these systems have data logging capabilities. However, at least one backpack-type sprayer includes a component designed to (optionally) record GPS and herbicide flow rate data. However, the data recording devices are components of the backpack and are not integrated into a handheld sprayer. Further, the data generated by the backpack systems is not accurate and the systems lack a "plug-in, plug-out" means of transferring data.

Further, the prior art systems are generally not modular—so that the data-logging components are permanently mounted to the spraying device. Consequently, relatively simple problems (such as a clogged hose or nozzle) can take the entire spray system out of service for a day or more.

The need exists for a modular and operationally flexible data gathering and processing apparatus that is integrated into a conventional handheld wand-type sprayer. This disclosure is directed to a flexible and inexpensive handheld tool/apparatus that is compatible with a conventional wand-type sprayer and accurately tracks (among other things) the amounts and types of herbicides applied by a user. In the preferred embodiment, the apparatus described herein records field-generated data on a USB-type thumb drive that is easily removable and may be downloaded, copied, and/or shared with other land managers.

SUMMARY OF THE INVENTION

This disclosure is directed to a handheld data-logging spray apparatus. The apparatus comprises a spray delivery assembly in combination with a flow measurement means and a data integration module. The data integration module comprises at least a microcontroller and a geographic information system receiver. As an operator uses the handheld data-logging spray apparatus, the microcontroller records an amount of liquid dispensed by the handheld data-logging spray apparatus, and simultaneously records the geographic location of the apparatus.

BRIEF DESCRIPTION OF THE DRAWINGS

FIG. 5 is an example printout of the data downloaded from the handheld data-logging spray apparatus described herein.

DETAILED DESCRIPTION OF PREFERRED EMBODIMENTS

Figure 1:
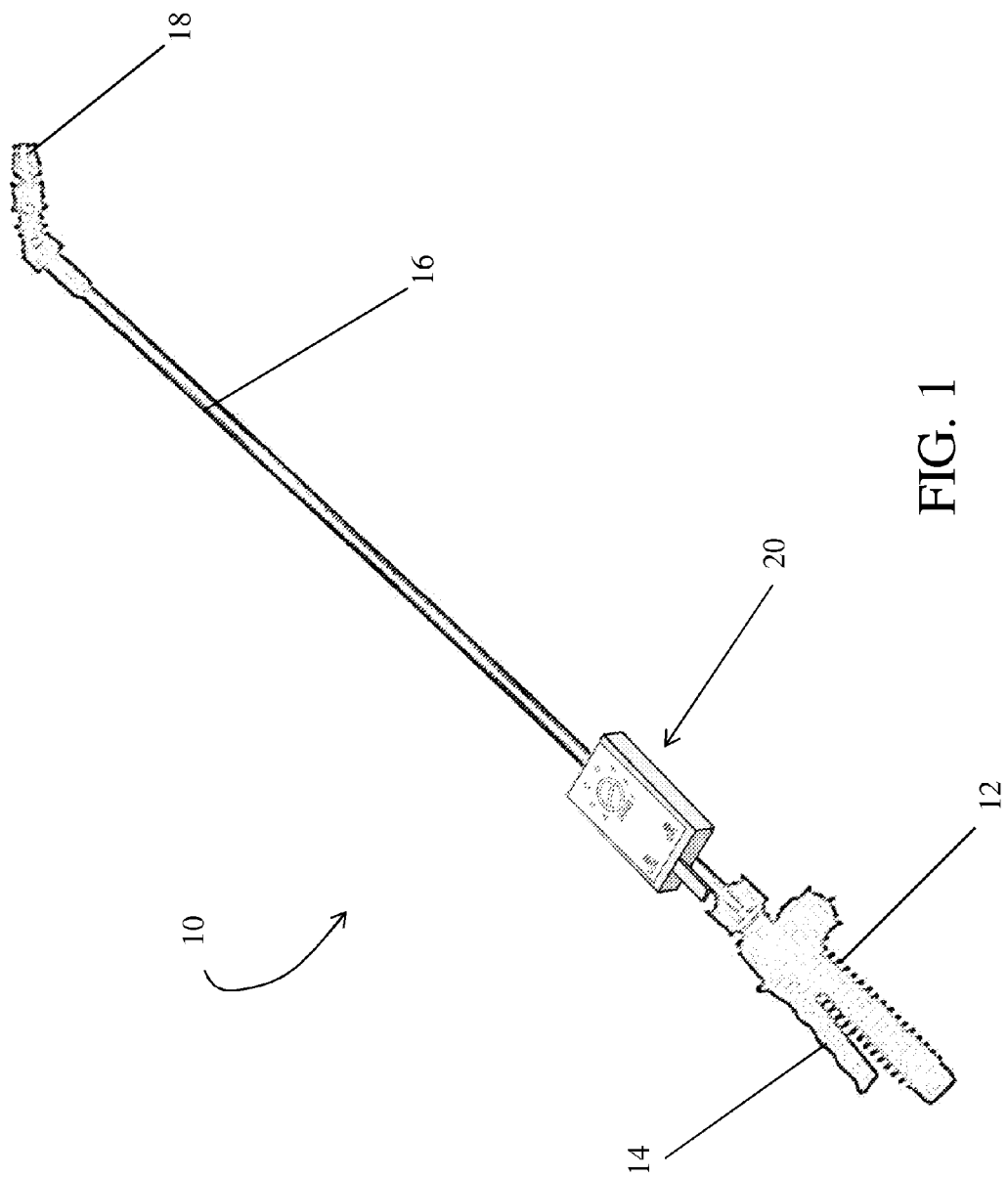
FIG. 1 is an elevational view of a handheld data-logging spray apparatus as described herein.

As generally shown in FIG. 1, the apparatus described herein comprises a handheld data-logging spray apparatus 10. The handheld data-logging spray apparatus 10 comprises a spray delivery assembly 12, 14, 16, 18 in combination with a data gathering and processing unit 20. In the preferred embodiment, the spray delivery assembly 12, 14, 16, 18 comprises a conventional sprayer hand grip 12 and associated trigger mechanism 14 as well as a conventional spray wand-type applicator 16 and nozzle 18. The data gathering and processing unit 20 is mounted between the sprayer hand grip 12 and the applicator wand 16.

For the purposes of this disclosure, a "handheld data-logging spray apparatus" is defined as an integral unit comprising at least a spray delivery assembly in combination with a data gathering and processing unit. The handheld data-logging spray apparatus is further defined as being small enough that the spray delivery assembly in combination with a data gathering and processing unit is capable of being held aloft and effectively operated by one hand. In other words, the handheld data-logging spray apparatus is small enough that a typical adult can effectively use the handheld data-logging spray apparatus (at least part of the time) with one hand.

Figure 2:
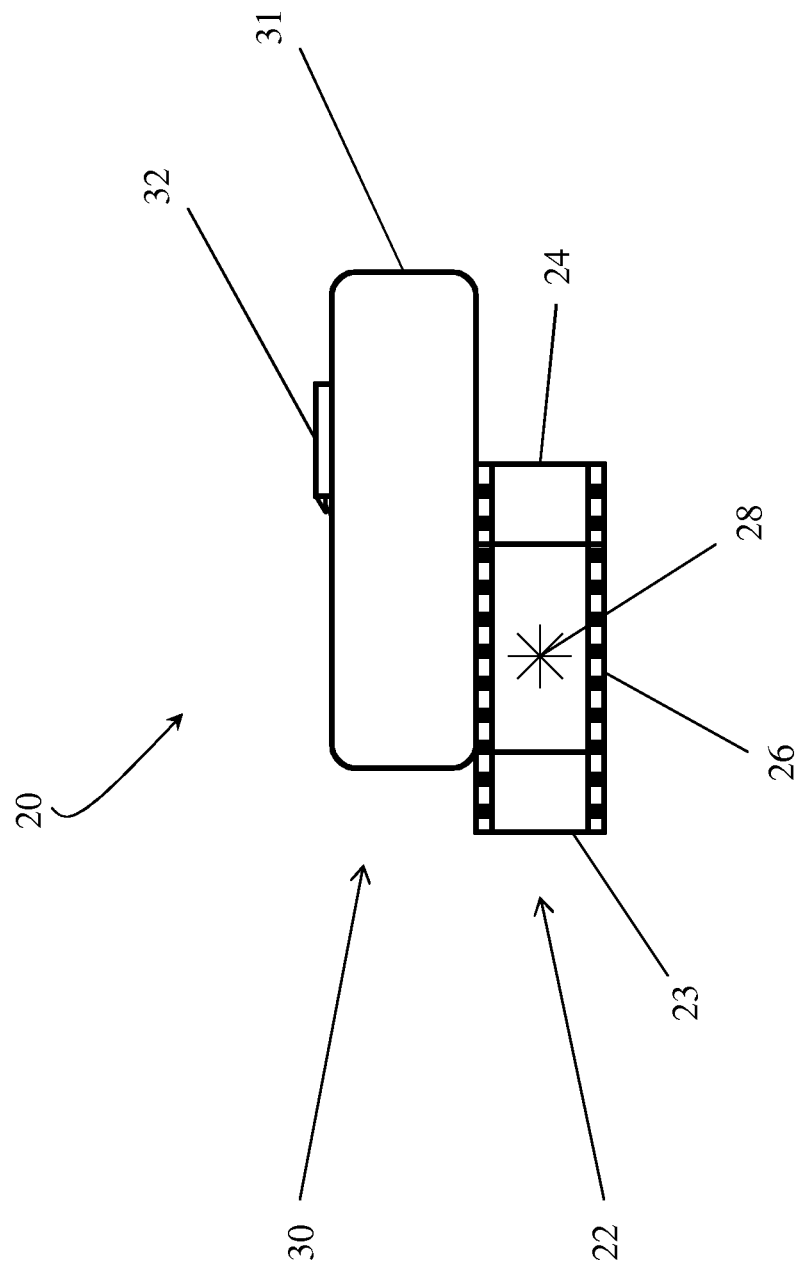
FIG. 2 is a partial sectional schematic view of the data gathering and processing unit.

As best shown in FIG. 2, the data gathering and processing unit 20 comprises a flow measurement module 22 attached to a data integration module 30. The flow measurement module 22 comprises an inlet section 23, an outlet section 24, and flow measurement chamber 26. The flow measurement module 22 also comprises a flow measurement means 28. In the preferred embodiment, the flow measurement means 28 is positioned inside the flow measurement chamber 26. The flow measurement means 28 measures liquid flow characteristics and generates liquid flow data as liquid moves through the flow measurement chamber 26. The liquid flow data is converted to an electronic signal and communicated to the data integration module 30.

In the preferred embodiment, the flow measurement means 28 comprises a pinwheel-type device (see FIG. 2) that is well-known in the fluid measurement arts. However, in alternative embodiments, the flow measurement means 28 may comprise a variety of flow measurement and sensor components that are assembled and configured to document and communicate the volume of liquid moving through the flow measurement chamber 26. These components may comprise various mechanical, electrical, and hydraulic pressure and flow measurement mechanisms that are configured to sense and communicate the pressure and/or volume of the fluid moving through the measurement chamber 26.

For example, in one alternative embodiment, the flow measurement means 28 may comprise an obstruction (such as a venturi component) so that sensors measuring a pressure drop across the obstruction can provide data used to deduce the fluid volume moving through the measurement chamber 26.

In further alternative embodiments, the fluid volume moving through the measurement chamber 26 may simply be deduced from the characteristics of the wand 16 (including the wand nozzle 18) and the length of time that a trigger mechanism 14 (or a liquid flow detection sensor/mechanism) is engaged so that the components of the flow measurement means 28 (may, or) may not be positioned in the flow measurement chamber 26. Essentially, any flow measurement means (with or without a mechanical flow measurement mechanism) 28 known in the art that is compatible with the size and nature of the handheld data-logging spray apparatus 10 should be considered within the scope of the disclosed apparatus 10.

Figure 3:
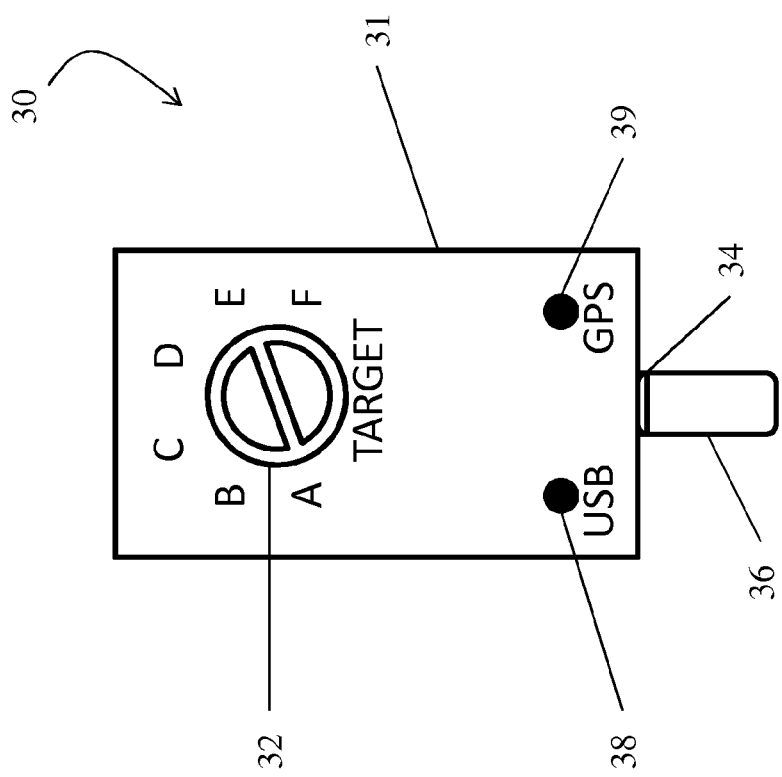
FIG. 3 is a top view of the data integration module.

The electronic signal comprising the liquid flow data is communicated to the data integration module 30 inside a watertight data integration module control housing 31. As best shown in FIG. 3, the exterior of the control housing 31 comprises a target selector switch 32 and a data storage interface port 34. The data storage interface port is designed to interface with a data storage means 36. In the preferred embodiment, the data storage interface port 34 comprises a USB port and the data storage means 36 comprises a USB thumb drive. FIG. 3 shows a USB thumb drive 36 engaged with the USB port 34.

In alternative embodiments, the data storage means 36 may comprises a data storage card, a removable hard drive, a floppy disk, a mini disk, an optical disk, a magnetic medium, or any other data storage medium/means known the art. Similarly, the data storage interface port 34 may comprise a mini-disk insertion tray, a data card slot, electrical plug-type connectors, various interfaces associated with the storage means 36 (as listed above), or any other type of data storage interface known in the art. In further alternative embodiments, the data integration module 30 may comprise a wireless transmitter so that data generated by the data integration module 30 may be transmitted wirelessly.

Figure 4:
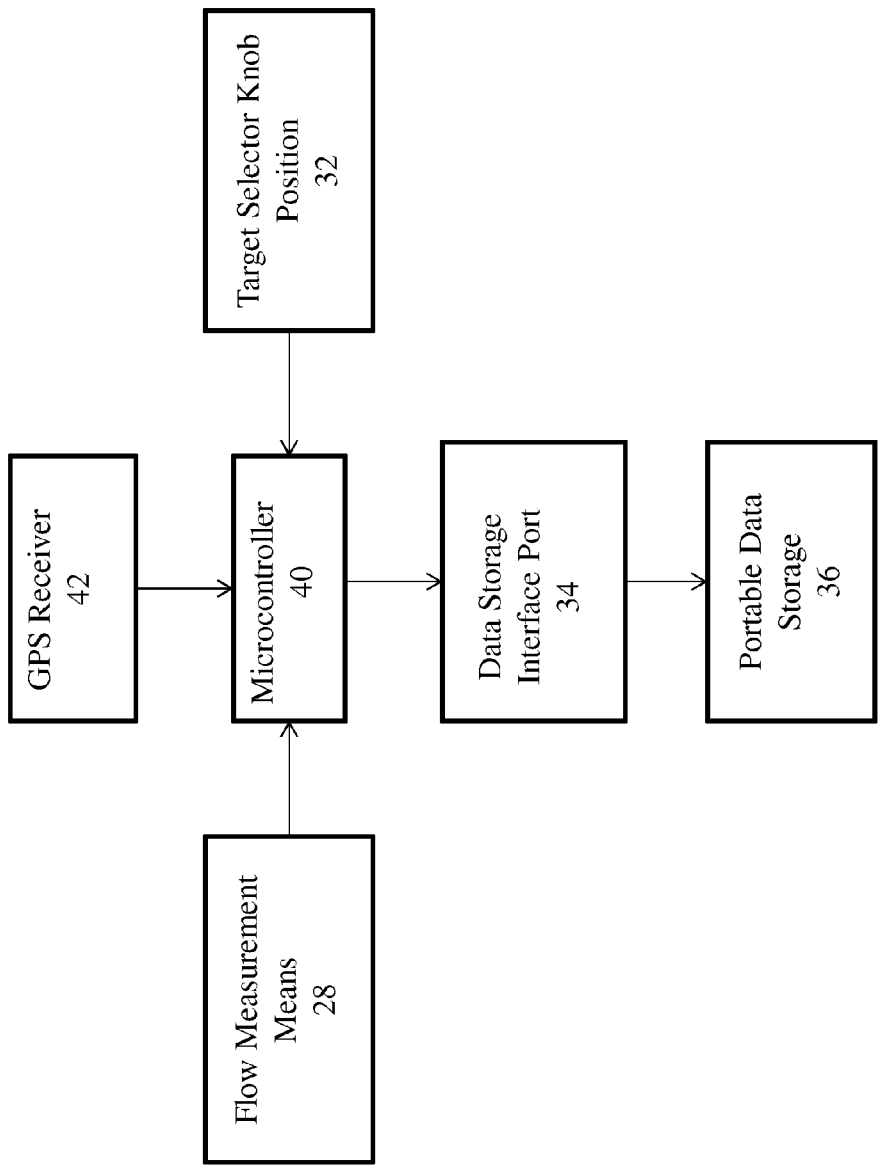
FIG. 4 is a data flow diagram for the handheld data-logging spray apparatus described herein.

As best shown in FIG. 4, the electronic flow measurement signal from the flow measurement means 28 is directed to a microcontroller 40. A geographic information system (preferably a global positioning system (GPS)) receiver 42 is also installed inside the data integration module control housing 31 so that the microcontroller 40 continuously receives geospatial location data from a plurality of satellites that are in communication with the GPS receiver 42. An indicator light 39 (see FIG. 3) on the face of the data integration module control housing 31 indicates that the microcontroller 40 is receiving a signal from the GPS receiver 42.

In the preferred embodiment, the microcontroller 40 comprises an ATMEL ATmega168 microcontroller. The microcontroller 40 should be capable of at least 8-bit processing speed and should be capable of low-power operations. The GPS receiver 42 comprises a GLOBALSAT 20 Channel EM-406A SiRF III GPS module. The GPS receiver 42 should be designed as a low power, multi-channel system that is WAAS enabled to collect accurate (<2 m) positions with a fast time to first fix.

In the preferred embodiment, the data storage interface 34 comprises a VINICULUM VDIP1 USB interface that is in communication with the microcontroller 40. The USB interface (including the USB port hardware) 34 must be able to save data to a USB thumb drive 36 and be capable of quick processing speeds. When data flows through the USB port 34 to the thumb drive 36, a light 38 on the data integration module control housing 31 flashes so that an operator knows that data is being recorded.

The handheld data-logging spray apparatus 10 works because the inventors have functionally synthesized and integrated these components to create an efficient data collection system. Data is collected only when liquid flow through the flow measurement module 22 is initiated (usually by pressing the sprayer trigger 14). For every second (or other pre-programmed time interval) of operation, the microcontroller 40 creates a sequential waypoint record.

In the preferred embodiment, as generally shown in FIG. 5, in addition to date/time and geospatial location (shown in the FIG. 5 "LAT" and "LONG" columns), the waypoint record also includes the number of satellites that are in communication with the GPS receiver (shown in the FIG. 5 "SAT" column) and an estimate of the geographic dilution of precision (GDOP) associated with the satellite measurement (shown in the FIG. 5 "PRECISION" column). This precision estimate is based on the configuration of the satellites in communication with the GPS receiver 42. When satellites are close together with small angular separation, GDOP estimates are higher. When satellites are further apart (wider angular separation), GDOP estimates are lower and more precise.

In the preferred embodiment, the liquid volume associated with each FIG. 5 waypoint is determined by an instantaneous electronic pulse received by the data integration module 30 from the flow measurement module 22. The instantaneous pulse is a measure of the instantaneous flow rate of the liquid passing through the flow measurement module 22 during the date/time associated with the waypoint. The microcontroller 40 extrapolates the instantaneous flow rate for a preselected time interval (preferably one second) and determines the estimated flow volume dispensed during the preselected time interval for each waypoint. The estimated flow volume for each selected waypoint is shown in the FIG. 5 column labeled "mls".

Each waypoint record also includes at least one user-selected variable associated with the position of the selection knob 32 positioned on the face of the data integration module control housing 31. Exactly what the various positions of the selector 32 indicate can be pre-programmed by an operator. In the preferred embodiment, the position of the selector switch 32 indicates the type of plant targeted by the herbicide treatment. In the FIG. 5 example data, various species (designated "Target Species (A-E)") are shown in the column labeled "TARGET".

In alternative embodiments, the selector switch (or, alternatively, switches) 32 may indicate the type of chemical/ herbicide that was applied, the name of an operator/technician, the name of a property, a customer name, or any other variable selected and programmed by a user.

One suggested selector switch embodiment contains two or more alpha-numeric digits, where each digital or mechanical switch can contain a single number (0-9) or letter (A-Z). In this embodiment, the TARGET can be identified with a two digit code. For instance, the operator would change the first switch to "J" and the second switch to "G" when spraying Johnson Grass. For this example, the TARGET column would contain "JG." This embodiment would reduce the need for further data analysis after the spraying event has been completed.

After the spraying process is complete, the operator simply removes the thumb drive (or other portable storage medium) 36 from the data integration module 30 and downloads the information to a computer. As discussed previously, FIG. 5 shows an example of data generated in accordance with the preferred embodiment. In the preferred embodiment, the data is stored as a tabular Coma Separated Value (CSV) file. However, in alternative embodiments, data can be stored as Keyhole Markup Language (KML) files, ESRI shapefiles, or any other data files known in the data processing art. Once the data is downloaded, the data file can be opened and manipulated using MICROSOFT EXCEL or other spreadsheet-type programs.

The data produced and stored by the current device can be directly downloaded into most other commercially-available geographic information systems. Unlike many prior art data gathering systems, data generated by the current device generally does not require intermediary (and sometimes proprietary) software to transform field-generated data. The data generated by the device described herein can be added to (for example) ArcGIS to generate and update comprehensive area maps with no additional data processing steps. The use of comprehensive maps enables land managers to see and evaluate the spread of invasive species and to develop a comprehensive plan to eradicate them. Over time, the data also enables land managers to see which eradication strategies are successful and where those strategies are best employed.

Figure 6:
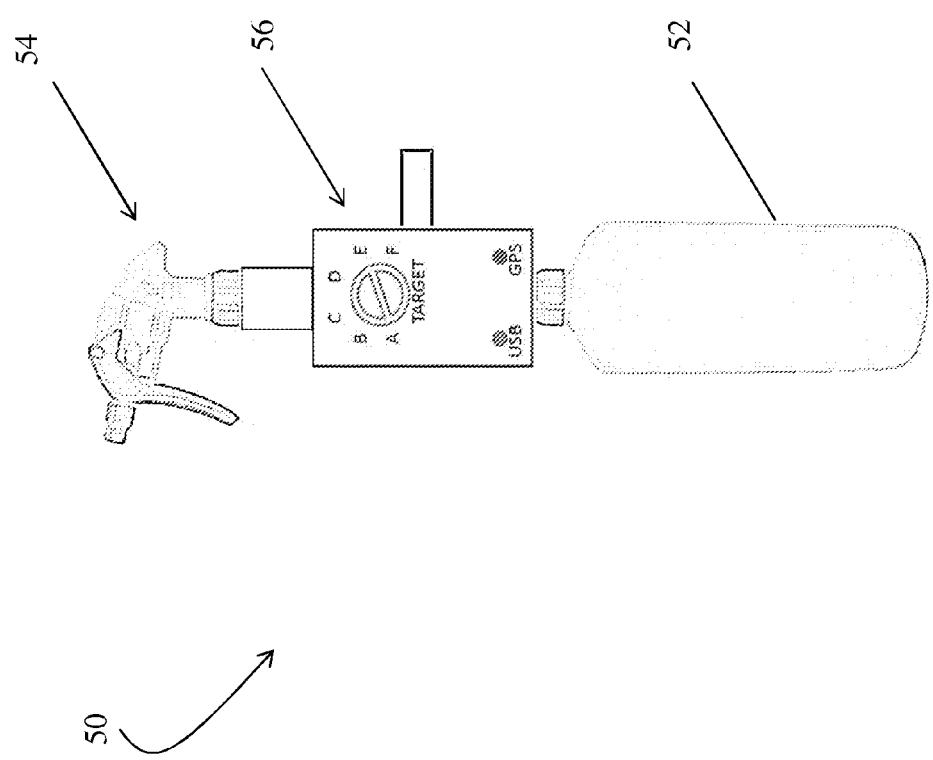
FIG. 6 is a profile view of an alternative embodiment of the handheld data-logging spray apparatus described herein.

FIG. 6 shows an alternative embodiment of the handheld data-logging spray apparatus shown FIG. 1. The FIG. 6 alternative embodiment is designated as a spray bottle-based handheld data logging spray apparatus 50.

For the purposes of this disclosure, a "spray bottle-based handheld spray apparatus" is defined as an apparatus wherein a spray reservoir is included as a part of the apparatus so that at least the spray delivery assembly can be operated with one hand and the entire spray bottle-based handheld spray apparatus is small enough to be carried and operated by one adult. The spray bottle-based handheld data-logging spray apparatus is further defined as mobile and small enough that a typical adult can effectively use the spray bottle-based handheld data-logging spray apparatus (at least part of the time) with one hand.

The FIG. 6 alternative embodiment operates similarly to the preferred embodiment, however in this alternative embodiment the spray delivery assembly 54 comprises a conventional pump-type spray apparatus. Specifically, in operation, liquid is drawn upwardly through the data gathering and processing unit 56 and sprayed out of a conventional pump-type spray apparatus (i.e. the spray delivery assembly 54). The spray bottle-based apparatus 50 allows even greater operational flexibility while retaining the ability to accurately document all chemical treatment. In one further embodiment, the spray delivery system 52 and data gathering and processing unit 56 are carried in one hand and the reservoir is carried in another hand or a backpack so that the entire apparatus 50 is mobile.

For the foregoing reasons, it is clear that the method and apparatus described herein provides an innovative handheld data-logging spray apparatus. Although this disclosure is primarily directed to the control of invasive plants, the handheld data-logging spray apparatus can be sued to apply and document essentially any chemical compatible with conventional sprayers.

The current apparatus may be modified in multiple ways and applied in various technological applications. The disclosed sprayer may be customized as required by a specific operation or application, and the individual components may be modified and defined, as required, to achieve the desired result.

Although the materials of construction are not described, they may include a variety of compositions consistent with the function described herein. Such variations are not to be regarded as a departure from the spirit and scope of this disclosure, and all such modifications as would be obvious to one skilled in the art are intended to be included within the scope of the following claims.

What is claimed is:

1. A handheld data-logging spray apparatus comprising:
   a spray delivery assembly comprising a handheld liquid reservoir bottle and a finger-pumpable trigger;
   a microcontroller;
   a flow measurement means; and
   a geographic information system receiver;
   whereby the handheld data-logging spray apparatus is structured so that as an operator uses his fingers to pump the trigger of the apparatus, the microcontroller records an amount of a liquid dispensed from the handheld liquid reservoir bottle through the apparatus, and simultaneously records a geographic location of the apparatus.

2. The apparatus of claim 1 wherein the geographic information system receiver comprises a global positioning system (GPS) receiver, the microcontroller and the GPS receiver being housed within a control housing adjacent the finger-pumpable trigger, the GPS and the microcontroller comprising a data integration module.

3. The apparatus of claim 2 wherein the data integration module further comprises a data storage interface port and a mobile data storage medium.

4. The apparatus of claim 3 wherein the storage interface port comprises a USB port and the mobile data storage medium comprises a USB flash drive.

5. The apparatus of claim 2 wherein the apparatus is structured so that, an amount of liquid dispensed from the handheld liquid reservoir bottle, and a geographic location of the handheld data-logging spray apparatus are recorded as periodically occurring waypoints, each waypoint further comprising a number of satellites engaged by a GPS recorder and a projected GPS error.

6. The apparatus of claim 5 wherein each waypoint further comprises a user-selected variable(s), the user-selected variable(s) being designated by a position of a selection knob.

7. The apparatus of claim 2 wherein the flow measurement means comprises a flow measurement means generating an electrical signal, the electrical signal being directed to the microcontroller.

8. The apparatus of claim 7 wherein the flow measurement means is positioned in a flow measurement chamber, the flow measurement means measuring an amount of liquid pumped (via the finger-pumpable trigger) from the handheld liquid reservoir bottle and through the flow measurement chamber.

9. The apparatus of claim 8 wherein the flow measurement chamber abuts the control housing.

10. The apparatus of claim 7 wherein the flow measurement means comprises a pinwheel device.

11. The apparatus of claim 1 wherein a liquid flow volume is deduced based on an amount of time that liquid flows from the handheld liquid reservoir bottle and through the handheld data-logging spray apparatus.

12. The apparatus of claim 1 wherein the spray delivery assembly comprises a sprayer hand grip, and nozzle so that, when the trigger is pumped, a liquid is pumped up from the handheld liquid reservoir bottle, the liquid is directed through the sprayer hand grip and nozzle, thereby dispensing the liquid.

13. A method of spraying and thereby treating plants and recording data documenting the spray treatment;
the steps of the method comprising:
(a) providing the handheld data-logging spray apparatus of claim 1;
(b) connecting a portion of the spray delivery assembly to a handheld liquid reservoir bottle containing a liquid;
(c) spraying target plants with the liquid by pumping a trigger on the handheld data-logging spray apparatus; and,
(d) during step (c), recording waypoint information on a data storage means.

14. The method of claim 13 wherein, in step (d), the waypoint information comprises at least time, geographic location, and volume of the liquid dispensed by the handheld data-logging spray apparatus.

15. The method of claim 13 further comprising:
(e) downloading waypoint data from the data storage means to a computer.

16. The method of claim 15 wherein the waypoint data is in a spread sheet format.

17. The method of claim 13 wherein the liquid comprises a non-water liquid.

18. A method of making a handheld data-logging spray apparatus, the method comprising the steps of:
(a) providing a microcontroller, the microcontroller comprising a programmable data processing data recorder;
(b) connecting the microcontroller to a geographic information system;
(c) integrating the microcontroller and geographic information system into a control housing to create a data integration module, the data integration module being capable of operating as a handheld component; and
(d) connecting the data integration module to a handheld spray assembly;
(e) connecting a flow measurement module to the data integration module and the spray assembly so that the flow measurement module provides an electrical flow volume signal to the microcontroller as a liquid is pumped from a handheld liquid reservoir bottle and through the handheld spray assembly and out of a spray assembly nozzle when a finger-pumpable trigger is pumped.

19. The method of claim 18 further comprising:
(f) programming the microcontroller so that the microcontroller records sequential waypoints, each waypoint comprising at least a time, geographic location, and an amount of a liquid that is dispensed from the handheld data-logging spray apparatus.

\* \* \* \* \*